United States Patent [19]
Bongianni

[11] 3,931,598
[45] Jan. 6, 1976

[54] NORMAL REFLECTIVE ARRAY COMPRESSOR AND METHOD

[75] Inventor: Wayne L. Bongianni, Placentia, Calif.

[73] Assignee: The United States of America as represented by the Secretary of the Navy, Washington, D.C.

[22] Filed: Dec. 17, 1974

[21] Appl. No.: 533,554

[52] U.S. Cl............... 333/30 R; 310/8.2; 310/9.8; 333/72
[51] Int. Cl.². H03H 9/26; H03H 9/30; H03H 9/22; H01L 41/08
[58] Field of Search ......... 333/30 R, 72; 310/8, 8.1, 310/8.3, 9.7, 9.8, 8.4, 8.5, 8.6, 9.5

[56] References Cited
UNITED STATES PATENTS
3,283,264  11/1966  Papadakis .................. 333/30 R X

OTHER PUBLICATIONS

Humphreys et al., "Acoustic Bulk–Surface–Wave Transducer," in Electronic Letters, Vol. 5, No. 9, May 1, 1969; pp. 175–176.

*Primary Examiner*—Archie R. Borchelt
*Assistant Examiner*—Marvin Nussbaum
*Attorney, Agent, or Firm*—R. S. Sciascia; P. Schneider; W. T. Ellis

[57] ABSTRACT

Surface acoustic waves on a piezoelectric crystal substrate beat with the bulk shear wave energy generated by the incident surface wave and which pass through the thickness of the substrate to produce a beat signal which is collected and is useful in pulse systems.

5 Claims, 2 Drawing Figures

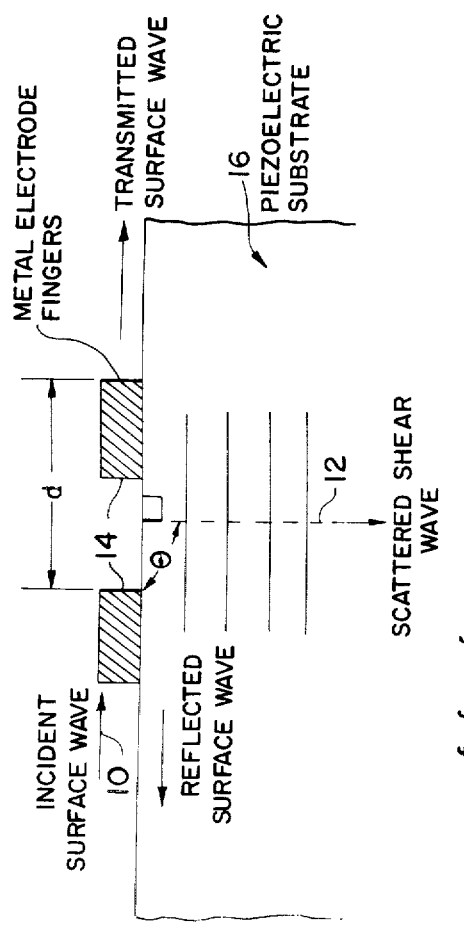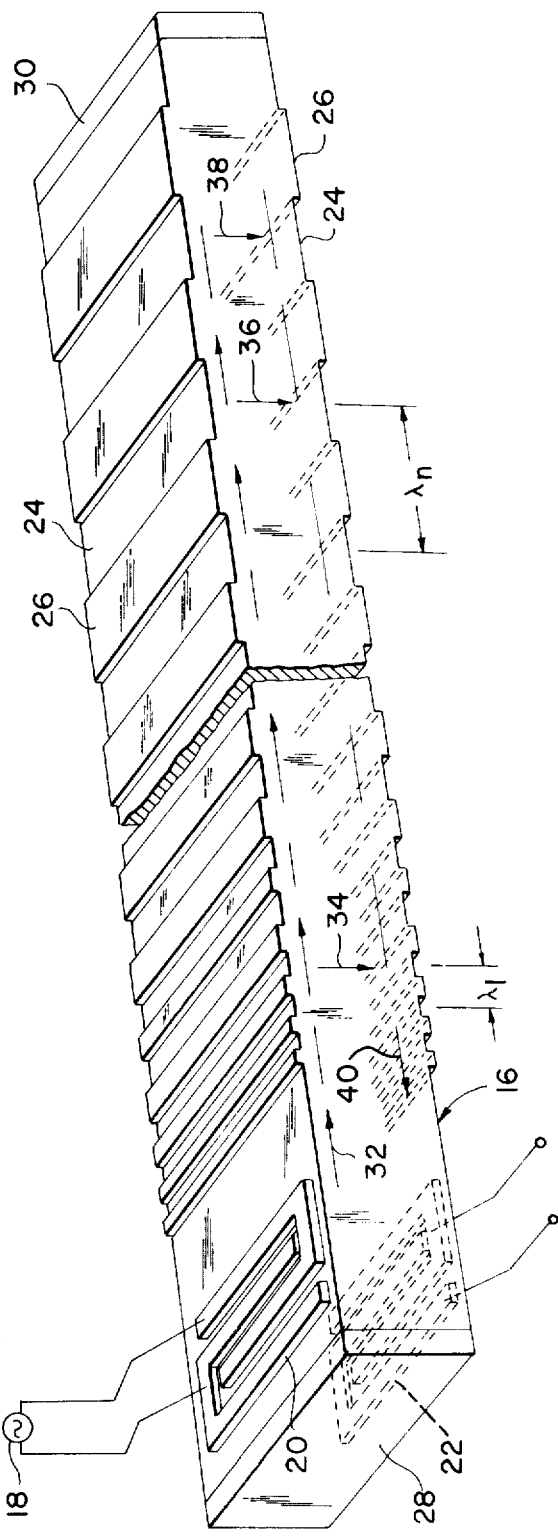

NORMAL REFLECTIVE ARRAY COMPRESSOR AND METHOD

BACKGROUND OF THE INVENTION

This invention relates to acoustic surface wave devices employing piezoelectric crystal substrates.

Acoustic delay lines, particularly suitable for microwave frequencies and utilizing surface waves on the face of a piezoelectric crystal substrate are known. In such delay lines, the surface waves may be launched by an interdigital type of input transducer having electrode fingers affixed to the propagation surface by standard photolithographic techniques. According to one such known device described in Electronic Letters, Volume 8, Number 6, published Aug. 10, 1972 the surface waves travel over the propagation surface through a grating consisting of numerous parallel arranged electrodes spaced from one another by grooves the spacings of which increase as a function of the distance from the interdigital electrode input transducer.

I have observed that there is an unexpected beating of a surface acoustic wave signal with a spurious signal believed to be caused by the bulk shear wave generated by interaction of the surface wave with a metal electrode pattern. FIG. 1 shows how a surface acoustic wave is incident on an interdigital electrode pattern common to surface acoustic wave transducers, and how a scattered shear wave is generated in a direction normal (at right angles) to the plane of the surface along which the launched or transmitted surface waves travel for a particular surface electrode or finger spacing.

A problem with the reflective array compressor (RAC) described and illustrated in the Electronic Letters article is that the acoustic beam is critically controlled by the orientation of the scatterers (etched grooves) which scatter energy in the plane of the surface wave. These electrode fingers in the arrays must be at about 45° with respect to the beam direction. Misorientation in the prior art with respect to the crystal axis requires angle compensation in the form of metal film wedges. This last compensation is an involved and tedious process. Also, the scattering angle is temperature dependent, which makes the opeeration vulnerable to temperature changes.

The delay line of the present invention does not suffer from the foregoing problem because the waves are guided by the planar surface, and oppositely disposed surfaces of the crystal substrate of the invention are used to form the legs which the beams must traverse and the scatterers (electrodes) must also be on these same surfaces. The device of the invention has the additional advantage of requiring only half of the volume of the piezoelectric substrate because both oppositely disposed surfaces or faces of the substrate are used. Because the delay of the invention scatters energy at right angles to the plane of the surface wave and through the thickness of the piezoelectric crystal substrate, there is an ease of fabrication and operation which is lacking in the foregoing known type of reflective array compressor.

SUMMARY OF THE INVENTION

The present invention is a dispersive delay line of very large time-bandwidth product which makes use of the conversion of the acoustic surface wave to the bulk shear wave which passes through the thickness of a piezoelectric crystal substrate. The substrate preferably is lithium niobate ($LiNbO_3$). The interdigital input transducer is affixed to one planar surface of the substrate and the interdigital output transducer is affixed to the other planar surface of the substrate. Electrode gratings whose spacing increase as a function of distance from the transducers are affixed to opposite planar surfaces of the substrate in such manner that the electrodes of the input transducer are precisely in line with the electrodes of the output transducer and the electrodes of oppositely disposed gratings are also precisely in line with one another. At different points on the surface containing the input transducer some frequency component is scattered through the substrate as a shear bulk wave to the grating on the opposite surface which, in turn, converts or scatters the bulk shear wave into another surface wave which proceeds to output transducer where it can be detected. In like fashion the center and lower frequency components would be operated upon. The different path lengths for different components yield the different delays and hence the frequency components are dispersed.

An object of the invention is to convert a surface acoustic wave to a bulk wave and vice versa in a piezoelectric crystal substrate to produce a controlled delay line having a large time-bandwidth product.

Another object of the invention is to provide a new and improved surface wave dispersive delay line which utilizes the launched surface wave to produce a scattered bulk shear wave which is reflected downward through the thickness of the piezoelectric crystal substrate and then converted back to a surface wave.

Other objects, advantages and features of the invention will appear from a reading of the following detailed description when taken in conjunction with the accompanying drawing.

BRIEF DESCRIPTION OF THE DRAWING

FIG. 1 is given by way of explanation and shows how a surface acoustic wave is incident on an interdigital electrode pattern common to surface acoustic wave transducers; and FIG. 2 is a perspective view of an embodiment of the invention.

DETAILED DESCRIPTION

FIG. 1 illustrates how the incident surface wave 10 is scattered into a bulk shear wave 12. The bulk shear wave is at right angles (normal) to the incident surface wave when the spacing $d$ between electrodes or fingers 14 is equal to $\lambda$, where $\lambda$ is the wavelength of the surface wave. The scattering is the result of the impedance mismatch introduced by the conductive electrodes on the normally insulative surface of the piezoelectric substrate 16. The amount of energy scattered into the bulk wave 12 is related directly to the number of electrode fingers present of spacing $d = \lambda$. The scattering of the electrodes into the shear mode removes energy from the surface wave.

The invention, as shown in the embodiment of FIG. 2, utilizes the shear wave energy which goes down into the piezoelectric crystal substrate 12 at right angles to the direction of propagation to cause the shear wave at the bottom surface of the substrate to be reflected and then converted back to a surface wave. There are two types of acoustic waves, longitudinal and shear. The conversion of surface waves to shear wave is utilized to produce a dispersive delay line of very large time-bandwidth. Because the scatterers (electrode fingers) lie on both flat parallel surfaces of the piezoelectric substrate, the surfaces form the legs which the beam must traverse, and there is avoided any problem of misorientation with respect to the axis of the piezoelectric crystal substrate such as is encountered in the prior art delay line described in the foregoing Electronics Letters article.

The solid piezoelectric substrate 12 is preferably lithium niobate ($LiNbO_3$) because of its negligible propagation loss in the very high frequency range of upward of 10 MHZ and its high piezoelectric constant which increases scattering efficiency. Interdigital (IDT) type of input and output transducers 20 and 22 are respectively affixed on the upper and lower surfaces or faces of the substrate. An electromagnetic input signal of wide range, for example 10 MHZ to 300 MHZ, is applied from source 18 to the fingers of the input transducer 20, and a receiver, not shown, is adapted to be connected to the output transducer 22 for detecting the output surface wave. Other devices according to the invention may have input signals ranging from 300 MHZ to 1,000 MHZ. The interdigital transducer is an efficient means for generating and sensing surface waves in piezoelectric media, and may be fabricated on the piezoelectric substrate 12 by regular photo-etching processes. The number of fingers of the transducers shown in the FIG. 2 is merely for purposes of illustration and may be twenty or thirty (not too material) since the number is a function of the frequency spectrum and bandwidth requirements. The substrate 16 converts an electric wave into a mechanical stress and vice versa. The fingers of input IDT 20 generates an electric-field-induced stress which propagates, much like ripples in a lake, along the surface of the substrate. The contribution from each finger pair is proportional to the applied voltage signal from source 18 and a function of the finger spacing. On both surfaces along the length of the substrate there are positioned etched grooves 24 separated by metal electrodes 26 placed on these surfaces by a regular photo-etching process. The spacings between the metal electrodes 26 on both surfaces, as well as their widths increase as a function of distance from the transducers if a negative dispersion is required and the spacings and widths would decrease if a positive dispersion is required. At the high frequency end, that is, the location nearest the transducers, the spacing $\lambda1$ between fingers corresponds to the mean wavelengths of the higher frequencies; at the intermediate frequency range in the center of the substrate the spacing between fingers corresponds to the mean wavelength of the intermediate frequencies, while at the low frequency range at the end of the substrate farthest from the IDT transducers 20 and 22 the spacing $\lambda n$ corresponds to the mean wavelength at the low frequencies in the frequency spectrum range, in the illustration of FIG. 2.

Both end edges of the solid single crystal piezoelectric substrate are provided with layers 28 and 30 of lossy coatings, such as wax, to absorb energy at these respective end edges to reduce the amount of multiple pass reflections of energy therefrom which contribute spurious signals. The substrate 16 is not limited to the rectangular shape shown. Typical dimensions for the rectangular-shaped substrate would be 0.1cm to 10cm wide, 0.1cm to 100cm long and 0.1cm to 2cm thick.

The electrode finger spacings and widths may vary in the manner hereinabove described and this causes the dispersion in the delay line; i.e. some frequencies are more or less delayed than others. For dispersion, the phase is quadratic with frequency while the time versus frequency is linear. It should be noted that the electrode fingers and grooves at the bottom surface of the $LiNbO_3$ substrate are precisely in line with and have the same widths as the fingers and grooves on the top surface immediately thereabove. The beam-width of the incident wave front is equal to or less than the width of the electrodes, for example nominally 10 wavelengths or more.

In the operation of the dispersive delay line of the invention it is believed that the changing electrode spacing is principally responsible for the reflection; therefore, the wave will tend to deflect in the direction of increased spacing. The incident surface wave launched at the top surface of the crystal substrate shown in FIG. 2 will travel in a direction 32 from the input transducer 20 toward the absorbent layer 30. Shear waves indicated diagramatically by arrows 34, 36 and 38 at different points along the length of the electrode finger array travel down through the substrate, are reflected by the bottom surface and are converted back to the bottom surface to surface waves which travel in the direction of the arrow 40 back to the output transducer 22.

By means of the invention, and by way of illustration only and not by way of limitation a 50 MHZ bandwidth over a 100 $\mu$sec differential delay is feasible with a time bandwidth product of 5000:1.

It should be understood that the theoretical explanation given above is merely for purpose of exposition and in order that the invention may be better appreciated. While this theoretical explanation is believed to be correct, it is not of necessity complete, nor does the operation of the invention depend upon its accuracy or otherwise.

Obviously, many modifications and variations of the present invention are possible in light of the above teachings. It is therefore to be understood that, within the scope of the appended claims, the invention may be practiced otherwise than as specifically described.

What is claimed is:

1. An acoustic wave device comprising:
   a piezoelectric substrate having oppositely disposed flat surfaces;
   an input transducer on one surface of said substrate for launching acoustic surface waves traveling down said surface;
   an output transducer on the other opposite surface of said transducer for collecting acoustic surface waves traveling on said opposite surface in a direction opposite to the direction of travel on said one surface;
   said input and output transducers comprising metallic electrodes, the electrodes of said input transducer being in line with corresponding electrodes of said output transducer;
   arrays of electrode fingers on each of said surfaces, each said array having spacings between adjacent electrodes thereof which vary along the length of the substrate over which the acoustic surface wave is adapted to travel; the widths of the electrodes and the spacings between them of both arrays being the same with corresponding electrodes and spacings of both arrays on said opposite surfaces being in line with each other.

2. An acoustic wave device according to claim 1, wherein said:
   transducers are of the interdigital type,
   the spacings between the electrode fingers of both arrays similarly increasing with distance from said transducers.

3. An acoustic wave device according to claim 1, wherein:
   said transducers are of the interdigital type,
   the spacings between the electrode fingers of both arrays similarly decreasing with distance from said transducers.

4. An acoustic wave device according to claim 1, wherein:
   said substrate is rectangular in shape and made of lithium niobate, said substrate being 0.1cm to 10cm wide, 0.1cm to 100cm long, and 0.1cm to 2cm thick,
   the ends of said substrate being covered with absorbent material to reduce reflections therefrom,
   said input and output transducers being positioned near the same end of said substrate,
   means for applying a wide range of very high frequencies to said input transducer, and
   receiver means coupled to said output transducer.

5. An acoustic wave device according to claim 1, wherein said oppositely disposed flat surfaces are parallel to each other.

* * * * *